(12) United States Patent
Tanaka

(10) Patent No.: US 6,330,186 B2
(45) Date of Patent: *Dec. 11, 2001

(54) NON-VOLATILE SEMICONDUCTOR MEMORY DEVICE HAVING ELECTRICALLY PROGRAMABLE MEMORY MATRIX ARRAY

(75) Inventor: Toshiaki Tanaka, Tokyo (JP)

(73) Assignee: Citizen Watch Co, Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/125,258
(22) PCT Filed: Feb. 19, 1997
(86) PCT No.: PCT/JP97/00437
  § 371 Date: Mar. 1, 1999
  § 102(e) Date: Mar. 1, 1999
(87) PCT Pub. No.: WO97/30454
  PCT Pub. Date: Aug. 21, 1997

(30) Foreign Application Priority Data

Feb. 19, 1996 (JP) .......................................... 8-30516
Oct. 30, 1996 (JP) .................................. 8-287755

(51) Int. Cl.[7] ..................................................... G11C 16/04
(52) U.S. Cl. ................................ 365/185.11; 365/185.21; 365/185.22; 365/185.28
(58) Field of Search ........................... 365/185.11, 185.21, 365/185.22, 185.28, 185.01

(56) References Cited

U.S. PATENT DOCUMENTS 4,970,691 * 11/1990 Atsumi et al. ................... 365/189.11
5,544,114 * 8/1996 Gaultier et al. ....................... 365/202

* cited by examiner

*Primary Examiner*—Hoai V. Ho
(74) *Attorney, Agent, or Firm*—Greer, Burns & Crain, Ltd.

(57) ABSTRACT

A non-volatile semiconductor memory device is provided, this device having an electrically rewritable first non-volatile semiconductor memory matrix array and a second such non-volatile semiconductor memory matrix array that has exactly the same construction as and that uses a memory cell of the same construction as that used in the first non-volatile semiconductor memory matrix array, this memory device being capable of execution of selection of at least one of two conditions, one being a writing priority mode condition, in which by erasing data of one of the memory matrix arrays while simultaneously writing data into the other memory matrix array, and the other being a readout priority mode condition, in which an input data inverting circuit is provided for the purpose of programming data into the second memory matrix array that is the inverted data of the first memory matrix array, and in which a differential sense amplifier circuit is provided for the purpose of reading out data of the first and second memory matrix arrays.

6 Claims, 12 Drawing Sheets

NON-VOLATILE SEMICONDUCTOR MEMORY DEVICE HAVING ELECTRICALLY PROGRAMABLE MEMORY MATRIX ARRAY

FIELD OF THE INVENTION

The present invention relates to a method of programming and a method of reading out from a non-volatile semiconductor memory device, and more specifically to a method of programming data into a non-volatile memory matrix array, and to a non-volatile semiconductor memory device that has a characteristic method of reading data from a non-volatile memory matrix array, and which is particularly suitable for application to a high-speed readout system.

Additionally, the present invention relates to the circuit configuration of a non-volatile semiconductor memory and to a characteristic program method for deleting data from and writing data to a memory array with high speed, and in particular to a non-volatile semiconductor memory device which can be electrically overwritten.

BACKGROUND ART

FIG. 4 is a drawing which shows the configuration of a non-volatile semiconductor memory device of the past. First, the configuration of a non-volatile semiconductor memory device of the past will be described, with reference made to FIG. 4.

As shown in FIG. 4, the non-volatile semiconductor memory device has a control circuit 11, a memory matrix array 13, a row address selection circuit 15, a column address selection circuit 17, a column direction first program circuit 19, a row direction second program circuit 21, a differential sense amplifier circuit 23, an address decoder circuit 25, a comparison reference voltage generation circuit 27, and a data input/output switching circuit 29.

The control circuit 11 is connected to the row address selection circuit 15, the column address selection circuit 17, the column direction first program circuit 19, the row direction second program circuit 21, the differential sense amplifier circuit 23, the comparison reference voltage generation circuit 27, and the data input/output switching circuit 29.

The address decoder circuit 25 is connected to the row address selection circuit 15 and the column address selection circuit 17.

The row address selection circuit 15, the column direction first program circuit 19, and the row direction second program circuit 21 are each connected to the memory matrix array 13.

The data input/output switching circuit 29 is connected to the column address selection circuit 17, and the column address selection circuit 17 is connected to the memory matrix array 13 and the differential sense amplifier circuit 23. The comparison reference voltage generation circuit 27 is connected to the differential sense amplifier circuit 23.

The program operation in a non-volatile semiconductor memory device of the past will be described in terms of FIG. 4. An address signal 33 that is input to the non-volatile semiconductor memory device is input to the address decoder circuit 25, and sent to the row address selection circuit 15 and the column address selection circuit 17.

By means of the address signal 33 that is sent to the row address selection circuit 15 and the column address selection circuit 17, the row address selection circuit 15 and the column address selection circuit 17 select a specific memory of the memory matrix array.

A data 31 that is input to the data input/output switching circuit 29 is sent from the data input/output switching circuit 29 to the column address selection circuit 17 by a control signal from the control circuit 11, the data 31 being input to a specific memory of the memory matrix array that is selected by the row address selection circuit 15 and the column address selection circuit 17.

Finally, by means of a control signal from the control circuit 11, the column direction first program circuit 19 and row direction second program circuit 21 operate, data 31 being programmed into a specific memory of the memory matrix array 13 that is selected by the row address selection circuit 15 and the column address selection circuit 17.

Next, the operation of data readout in a non-volatile semiconductor memory device of the past will be described using FIG. 4. An address signal 33 which is input to the non-volatile semiconductor memory device is input to the address decoder circuit 25, this being sent to the row address selection circuit 15 and the column address selection circuit 17.

By means of the address signal 33 which is sent to the row address selection circuit 15 and the column address selection circuit 17, the row address selection circuit 15 and the column address selection circuit 17 select a specific memory of the memory matrix array 13.

The specific selected memory data of the memory matrix array 13 is sent to the differential sense amplifier circuit 23 via the column address selection circuit 17.

The differential sense amplifier circuit 23 is implemented by a conventional differential amplifier that is used in a general non-volatile semiconductor memory device, a signal voltage that is input to the differential sense amplifier circuit 23 from the comparison reference voltage generation circuit 27 is compared with a memory threshold voltage, which is the memory data that is input from the column address selection circuit 17, the result being sent to the input/output data switching circuit 29.

The signal that is sent to the data input/output switching circuit 29 is output as data 31 by means of a control signal from the control circuit 11.

Next, FIG. 3 will be used to describe the relationship between the memory data threshold voltage and the signal voltage from the comparison reference voltage generation circuit 27. FIG. 3 is a graph which shows the time variation characteristics of the threshold voltage value for memory into which data is programmed.

Both the curve 41 which shows retention of the memory threshold voltage value (data retention) for programming, from the threshold value 45 when the memory is fabricated, in the enhancement direction (that is, with the enhancement direction being the direction in which the Vth of an N-channel memory cell is a positive value of 0 or greater, the condition in the enhancement direction from the threshold value at the time of memory fabrication being defined as the written condition) and the curve 43 which shows the time variations of the memory threshold voltage value for programming, from the threshold value 45 when the memory is fabricated, in the depression direction (that is with the depression direction being the direction in which the Vth of an N-channel memory cell is a negative value of 0 or less, the condition in the depression direction from the threshold value at the time of memory fabrication being defined as the erase condition), approach the threshold voltage value 45 of the memory when fabricated.

In general, the comparison reference voltage value which is the signal voltage from the comparison reference voltage generation circuit 27 is designed to be the same as threshold voltage value 45 of the memory when it is fabricated. The threshold value at the time the memory is fabricated indicates the threshold value Vth (initial Vt) of a memory cell after the completion of the fabrication process and immediately before the first programming of the memory cell.

The differential sense amplifier circuit 23 of FIG. 4 makes a comparison between the threshold voltage value 45 of the memory at the time of fabrication of the memory, which is the same value as the comparison reference voltage value shown in FIG. 3 with the voltage value difference 47 of the memory threshold voltage value 41 of memory programmed in the enhancement direction, or a comparison between the threshold voltage value 45 of the memory at the time of fabrication of the memory, which is the same as the comparison reference voltage value, with the voltage value difference 49 of the memory threshold voltage value 45 of memory programmed in the depression direction, the results thereof being output to the data input/output switching circuit 29 of FIG. 4.

In a different aspect of a rewritable non-volatile semiconductor memory device of the past, and with particular regard to a configuration in the case of high-speed data erasing and data writing, the basic configuration is similar to that which is shown in FIG. 4, in which case the configuration, as illustrated, has a variety of specific signals that are input to the control circuit 11.

That is, a chip enable signal /CE 35, a data output enable signal /OE 36, a chip erase enable signal /EE 37, a program enable signal /PGM 38, and program high-voltage signal VPP 39 are input to the control circuit 11.

Next, FIG. 4 and FIG. 5 will be used to describe the chip erase, the write programming and the readout operations in an electrically rewritable non-volatile semiconductor memory device of the past.

First, using a non-volatile semiconductor memory device of the past such as shown in FIG. 4, the chip erase, write programming, and readout operations in an electrically rewritable non-volatile semiconductor memory device, using the timing which is shown in FIG. 5, will be described.

First, the chip erase will be described. As shown by the chip erase cycle 41 of FIG. 5, in order to erase all of the memories of the memory matrix array 13, the chip enable signal /CE 35 is set to low level, the program high-voltage signal VPP 39 is set to a high-voltage high level, the data output enable signal /OE 36 is set to the high level, the chip erase enable signal /EE 37 is set to the low level, and the program enable signal /PGM 38 is set to the high level. The above-noted settings set the chip erase cycle 41, the memory matrix array 13 being erased during several seconds of the chip erase cycle 41.

The circuit operation will be described next, using FIG. 4.

With regard to signals that are input to the non-volatile semiconductor memory device, when the chip enable signal /CE 35 is changed to the low level, the program high-voltage signal VPP 39 changes to the high-voltage high level, and the chip erase enable signal /EE 37 changes to the low level, the control circuit 11 starts an operation of the chip erase cycle 41 starts, an erase cycle signal being sent to the row address selection circuit 15, the column address selection circuit 17, the column direction first program circuit 19, and the row direction second program circuit 21.

The control circuit 11 maintains the chip erase cycle 41 for several seconds, and several seconds later sends a signal that ends the chip erase cycle 41 to the row address selection circuit 15, the column address selecting circuit 17, the column direction first program circuit 19, and the row direction second program circuit 21.

Next, the writing operation in an electrically rewritable non-volatile semiconductor memory device of the past will be described, using FIG. 5.

In order to write into a memory matrix array 13 such as shown in the write cycle of 42 of FIG. 5, the chip enable signal /CE 35 is set to low level, the program high-voltage signal VPP 39 is set to the high-voltage high level, the data output enable signal /OE 36 is set to the high level, the chip erase enable signal /EE 37 is set to the high level, and the program enable signal /PGM 38 is set to the low level, the address signals A0 through An 33 are input, and the data D0 through Dn 31 are input.

By means of the above-noted settings, the write cycle 42 is set, during the several hundred microseconds of which data D0 through Dn 31 are written into the memory matrix array 13 specified by the address signal A0 through An 33 which are input.

The operation of the circuit under the above-noted conditions will be described using FIG. 4.

With regard to the signals input to the non-volatile semiconductor memory device, when the chip enable signal /CE 35 changes to low, the program high-voltage signal VPP 39 changes to the high-voltage high level, and the program enable signal /PGM 38 changes to the low level, the control circuit 11 starts the write cycle 42, and sends a write cycle signal to the row address selection circuit 15, the column address selection circuit 17, the column direction first program circuit 19, the row direction second program circuit 21, and the data input/output switching circuit 29.

The control circuit 11 maintains the write cycle 42 for several hundred microseconds, after which it sends a signal that ends the write cycle 42 to the row address selection circuit 15, the column address selection circuit 17, the column direction first program circuit 19, the row direction second program circuit 21, and the data input/output switching circuit 29, thereby ending the write cycle 42.

In the earlier background art, however, because of variation with the passage of time of the data threshold voltage value which is stored into a storage memory cell and programmed, it approaches the threshold voltage value at the time the memory was fabricated (initial Vth).

Therefore, there is the problem that the signal voltage values of the memory signal which is input to the differential sense amplifier 23 and the voltage value differences 47 and 49 of the comparison reference voltage value generated by the comparison reference generation circuit 27 become small, the operation of the differential sense amplifier 23 becoming slow, this not only making the readout operation slow, but also increasing the possibility of the generation of a data readout error.

In the latter background art, in order to rewrite data of a memory array 11, it is necessary to execute a write cycle for rewriting the data in memory array 11, after executing a chip erase cycle 41, making it necessary to wait several seconds for the erase cycle before starting the write cycle, this making it difficult to shorten the processing speed.

DISCLOSURE OF THE INVENTION

The first object of the present invention is solve the above-noted problems by providing a non-volatile semiconductor memory device which is capable of high-speed memory data readout, while preventing data readout errors, even when a threshold voltage that is programmed into the memory changes, and a second object of the present invention is to solve the above-noted problems by providing an electrically rewritable non-volatile semiconductor memory device that is capable of high-speed writing of data into the memory array 11, without waiting for completion of the execution of a chip erase cycle of several seconds.

To achieve the above-noted object, the present invention has the following basic technical constitution. Specifically, a first aspect of a non-volatile semiconductor memory device according to the present invention is a non-volatile semiconductor memory device that has, for example, a memory matrix array that can be electrically programmed with data, this memory matrix array being formed by a first non-volatile semiconductor memory matrix array and a second non-volatile semiconductor memory matrix array of the same construction as the first non-volatile semiconductor memory matrix array, this second non-volatile semiconductor memory device further having an input data inverting circuit, which is connected to the second non-volatile semiconductor memory matrix array and which is for the purpose of programming inverted data of the first non-volatile semiconductor memory matrix array, and a differential sense amplifier circuit, which is connected to both the first non-volatile semiconductor memory matrix array and the second non-volatile semiconductor memory matrix array, for the purpose of reading out data of the first and second non-volatile semiconductor memory matrix arrays.

A second aspect of the present invention is a non-volatile semiconductor memory device that has, for example, and electrically programmable memory matrix array, this memory matrix array being formed by a first non-volatile semiconductor memory matrix array and a second non-volatile semiconductor memory matrix array of the same construction as the first non-volatile semiconductor memory matrix array, this memory device further having a memory matrix array selection circuit, which is connected in common to both the first and second non-volatile semiconductor memory matrix arrays, this memory matrix array selection circuit, in response to a selection control signal, issuing a command to selectively erase the data of one of the non-volatile semiconductor memory matrix arrays, and issuing a command to write data into the other non-volatile semiconductor memory matrix array.

SIMPLE DESCRIPTION OF THE DRAWINGS

PREFERRED EMBODIMENTS OF THE PRESENT INVENTION

A specific example of a non-volatile semiconductor memory device according to the present invention will be described below, with reference made to drawings.

Specifically, the first example of a non-volatile semiconductor memory device according to the present invention relates in particular to a programming and readout method of a non-volatile semiconductor memory device, and more specifically to a characteristic method of programming data into a non-volatile memory array and method of reading data from a non-volatile memory array, and more particularly to a non-volatile semiconductor memory device that is suitable for used in a data storage system which is required to store data for a long period of time.

Figure 1:
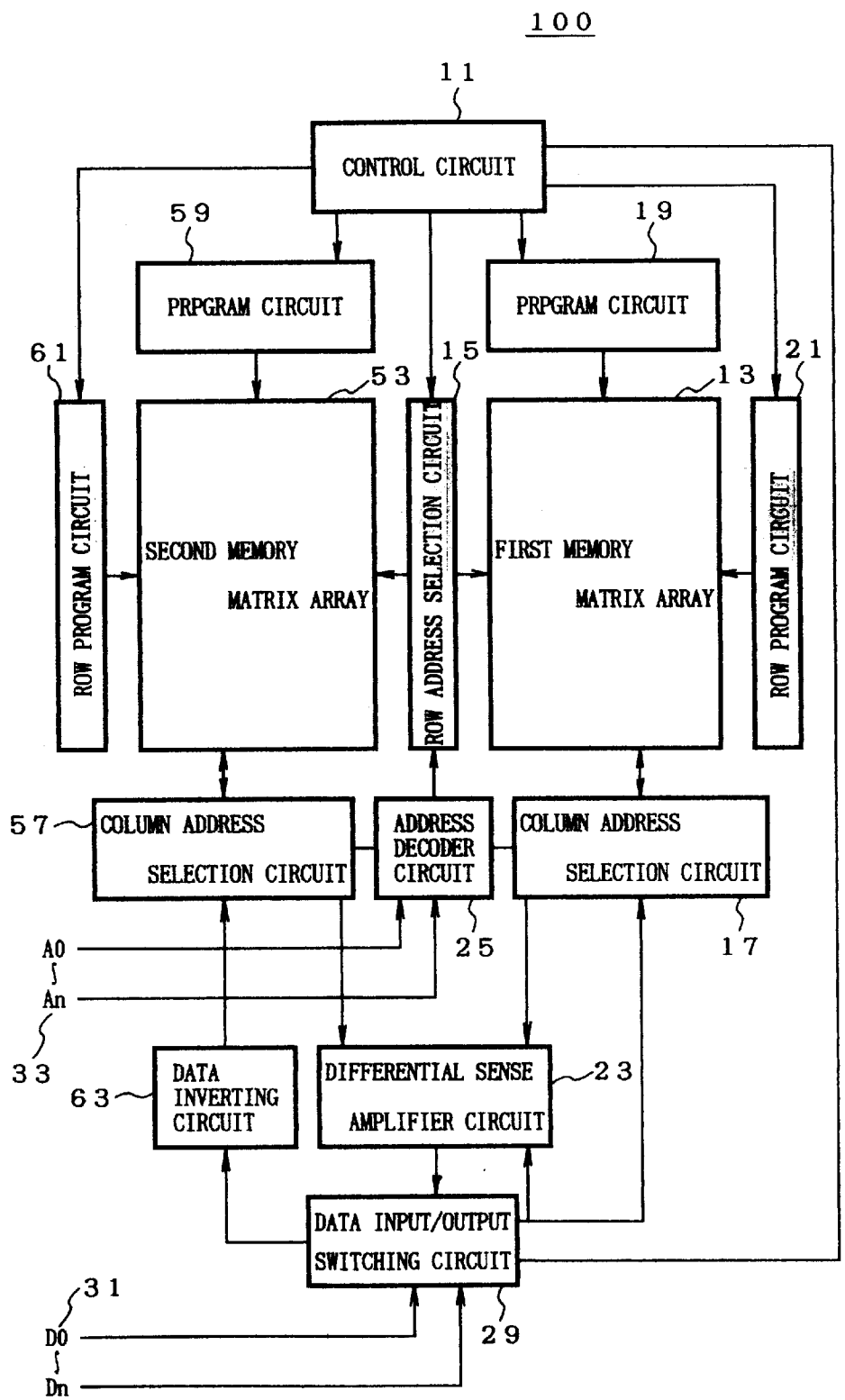
FIG. 1 is a block diagram which shows an example of the first aspect of an embodiment of a semiconductor memory device according to the present invention.

FIG. 1 shows an example of the configuration of a non-volatile semiconductor memory device 100 according to the present invention, this being a non-volatile semiconductor memory device 100 that has electrically programmable memory matrix arrays 13 and 53, these memory arrays being a first non-volatile semiconductor memory matrix array 13 and a second non-volatile semiconductor memory matrix array 53 that has the same construction as the first non-volatile semiconductor memory matrix array 13.

This second semiconductor memory device also has an input data inverting circuit 63 which is connected to the second non-volatile semiconductor memory matrix array 53 for the purpose of programming inverted data of the data to be stored in the first non-volatile semiconductor memory matrix array, and a differential sense amplifier circuit 23, which is connected to both the first non-volatile semiconductor memory array 13 and the second non-volatile semiconductor memory matrix array 53, for the purpose of reading out data of the first and second non-volatile semiconductor memory matrix arrays 13 and 53.

Specifically, a feature of this example is the disposition in parallel of two non-volatile semiconductor memory matrix arrays that have exactly the same configuration, the normal input being stored in a prescribed address of one of the non-volatile semiconductor memory matrix arrays, simultaneously with which data that is the inverted data of the opposite non-volatile semiconductor memory matrix array as mentioned above-noted being stored in the same address of the opposite non-volatile semiconductor memory matrix array.

That is, in the above-noted first example of a non-volatile semiconductor memory device 100 according to the present invention, the above-noted first and second non-volatile semiconductor memory matrix arrays 13 and 53 further have connected to them the separate column address selection circuits 17 and 57, commonly connected to the row address decoder 25, and the row address selection circuit 15, respectively.

It is also possible to provide two row address selection circuits 15, and this example one is provided, this being connected to both non-volatile semiconductor memory matrix arrays 13 and 53, so as to share the row address specification therebetween.

In this example, the first column address selection circuit 17 and row address selection circuit 15 that are connected to the first non-volatile semiconductor memory matrix array 13, and the second column address selection circuit 57 and row address selection circuit 15 connected to the second non-volatile semiconductor memory matrix array 53, function so as to select one and the same address position in both the first and second non-volatile semiconductor memory matrix arrays 13 and 53 for one program operation.

Another feature of this example of the present invention is that the differential sense amplifier circuit 23 is configured so as to directly output the voltage difference between data that is stored respectively in the same selected addresses of the first and second non-volatile semiconductor memory matrix arrays 13 and 53, so that in contrast to the method of the past there is no need to perform readout of data by comparison with respect to a reference voltage, thereby eliminating the need for a reference voltage generation circuit and comparison circuit that were used in a non-volatile semiconductor memory device of the past.

Because the operation of comparison between voltage data read out of the non-volatile semiconductor memory and a reference voltage is eliminated, there is a great shortening of the time for the readout operation.

The configuration and operation of the first example of the present invention is described in detail below.

Specifically, the configuration, programming method, and readout method of a non-volatile semiconductor memory device according to the present invention are as follows.

The above-noted example is a non-volatile semiconductor memory device 100 having an electrically programmable memory matrix array, this memory matrix array being formed by a first memory matrix array 13 and a second memory matrix array 53 that has the same construction as the first memory matrix array 13, and further the second memory matrix array 53 having an input data inverting circuit 63 which is connected to the second non-volatile semiconductor memory matrix array 53 for the purpose of programming inverted data of the data to be stored in the first non-volatile semiconductor memory matrix array 13, and a differential sense amplifier circuit 29, for the purpose of reading out data from both the first non-volatile semiconductor memory matrix array 13 and the second memory matrix array 53.

In this example, it is preferable that the above-noted memory matrix array use a semiconductor (MONOS) type memory transistor having a configuration of a gate layer comprising a silicon oxide film layer, a silicon nitride film layer, a silicon oxide film layer and a metal film layer laminated onto a substrate.

Figure 12:
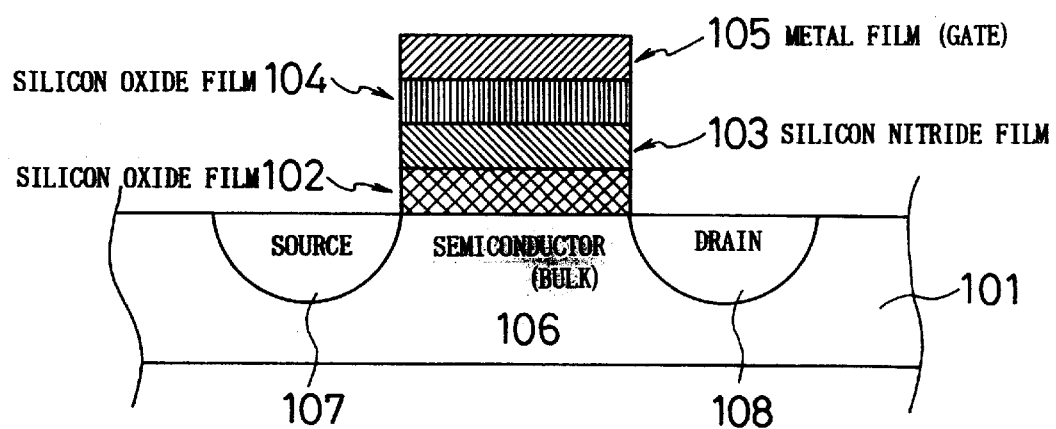
FIG. 12 is a cross-sectional view which shows an example of the configuration of a storage element used in a memory matrix array of a non-volatile semiconductor memory device according to the present invention.

An example of the configuration of a MONOS-type memory transistor used in the present invention is shown in FIG. 12.

Specifically, the above-noted MONOS-type memory transistor has a construction that is formed in the successive lamination as shown in the drawing, onto a gate region of a semiconductor substrate 101, into the semiconductor (bulk) 106 of which are provided a source region 107 and a drain region 108, of a silicon oxide film 102, a silicon nitride film 103, a silicon oxide film 104, and a metal film gate layer 105.

It is desirable that the memory cell size of the above-noted MONOS-type memory transistor used in the above-noted example of the present invention have, for example, a width/length ratio (W/L) of 10/2.8 (units: $\mu$m).

The non-volatile semiconductor memory device 100 of this example further has a control circuit 11 and, in addition to the row address selection circuit 15 and the column address selection circuits 17 and 57, has column direction first and second program circuits 19 and 59, row direction first and second program circuits 21 and 61, differential sense amplifier circuit 23, an address decoder circuit 25, a data input/output switching circuit 29, and a input data inverting circuit 63.

The column address selection circuits 17 and 57 each have exactly the same circuit configuration. The column direction first program circuits 19 and 59 also have exactly the same circuit configuration. Additionally, the row direction second program circuits 21 and 61 also have exactly the same circuit configuration.

The control circuit 11 is connected to the row address selection circuit 15, the column direction first and second program circuits 19 and 59, the row direction first and second row program circuits 21 and 61, the differential sense amplifier circuit 23, and the data input/output switching circuit 29.

The address decoder circuit 25 is connected to the column address selection circuits 17 and 57 and the row address selection circuit 15, and the row address selection circuit 15 is connected to the memory matrix arrays 13 and 53.

The column direction first program circuit 19 is connected to the memory matrix array 13, and the other column direction second program circuit 59 is connected to the memory matrix array 53.

The row direction first row program circuit 21 is connected to the memory matrix array 13, and the other second row program circuit 21 is connected to the memory matrix array 53.

The first column address selection circuit 17 is connected to the memory matrix array 13 and the differential sense amplifier circuit 23, and the other second column address selection circuit 57 is connected to the other memory matrix array 53 and to the differential sense amplifier circuit 23. Additionally, the differential sense amplifier circuit 23 is connected to the data input/output switching circuit 29.

The data input/output switching circuit 29 is connected to the first column address selection circuit 17 and the input data inverting circuit 63, and the input data inverting circuit 63 is connected to the other second column address selection circuit 57. The input data inverting circuit 63 is implemented by a conventional inverter circuit.

Next, the program operation of the first example of a non-volatile semiconductor memory device 100 according to the present invention, shown in FIG. 1, will be described.

The address signal 33 (A0 through An) that is input to the non-volatile semiconductor memory device is input to the address decoder circuit 25, this being sent to the row address selection circuit 15, and to the first and second column address selection circuits 17 and 57.

By means of the address signal 33 that is sent to the row address selection circuit 15 and to the column address selection circuits 17 and 57, a specific memory address in the memory matrix array 13 and in the other memory matrix array 53 is selected by the row address selection circuit 15 and the first and second column address selection circuits 17 and 57.

The data 31 (D0 through Dn) that is input to the data input/output switching circuit 29 is sent from the data input/output switching circuit 29 to the first column address selection circuit 17 and to the input data inverting circuit 63, by means of a control signal of the control circuit 11.

The data 31 that is sent to the data input/output switching circuit 29 is inverted and sent to the second column address selection circuit 57.

Then the data 31 is input to a memory having a specific address in the first memory matrix array 13 that is selected by the row address selection circuit 15 and the first column address selection circuit 17, the inverted data of the data 31 to be stored in the first memory matrix, being input to specific one and the same address in the second memory matrix array 53 as the address specifically designated in the first memory matrix array 13 specified by the row address selection circuit 15 and the second column address selection circuit 57.

Finally, by means of a control signal from the control circuit 11, the column direction first and second program circuits 19 and 59, and the row direction first and second program circuits 21 and 61 operate, and this operation programming data 31 into a specific address in the memory matrix array 13 which is specified by the row address selection circuit 15 and the first column address selection circuit 17, the inverted data of the data 31 being programmed into a specific address in the memory matrix array 53 selected by the row address selection circuit 15 and the second column address selection circuit 57.

That is, data with opposite phases are programmed into one and the same addresses in the first memory matrix array 13 and the second memory matrix array 53.

Next, the data readout operation in this example of the non-volatile semiconductor memory device 100 will be described.

The address signal 33 which is input to the non-volatile semiconductor memory device 100 is input to the address decoder circuit 25, and is sent to the row address selection circuit 15, and to the first and second column address selection circuits 17 and 57.

According to the address signal 33 that is sent to the row address selection circuit 15 and to the first and second column address selection circuits 17 and 57, the row address selection circuit 15 and first and second column address selection circuits 17 and 57 select a memory having a specific address in the first memory matrix array 13 and in the other second memory matrix array 53.

The memory data at the specific selected address in the first memory matrix array 13 is sent via the first column address selection circuit 17 to the differential sense amplifier circuit 23.

The memory data at the same specific selected address of the other second memory matrix array 53 is sent via the second column address selection circuit 57 to the differential sense amplifier circuit 23.

The differential sense amplifier circuit 23 is implemented by a conventional differential amplifier circuit such as used in a conventional non-volatile semiconductor memory device the memory threshold voltage value, which is the memory data of the first memory matrix array 13 from the first column address selection circuit 17 that is input to the differential sense amplifier circuit 23 being compared with the memory threshold voltage, which is the memory data of the second memory matrix array 53 from the second column address selection circuit 57, the difference therebetween being taken, and the result being sent to the data input/output switching circuit 29.

This signal, which is sent to the data input/output switching circuit 29 is output as data 31 in accordance with a control signal from the control circuit 11.

The memory data threshold voltage and the operation of the differential sense amplifier circuit 23 will be described next, using FIG. 2.

Figure 2:
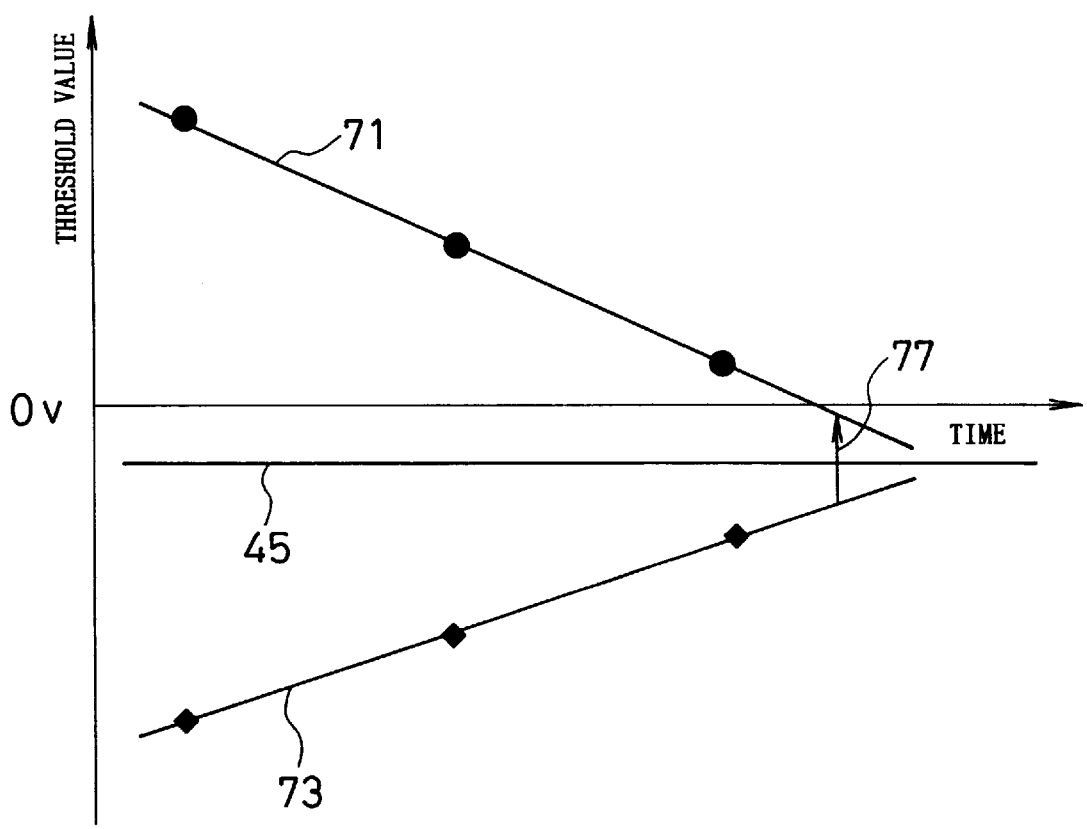
FIG. 2 is a drawing which illustrates the operation of the differential amplifier circuit in a non-volatile semiconductor memory device according to the first aspect of an embodiment of the present invention.
Figure 3:
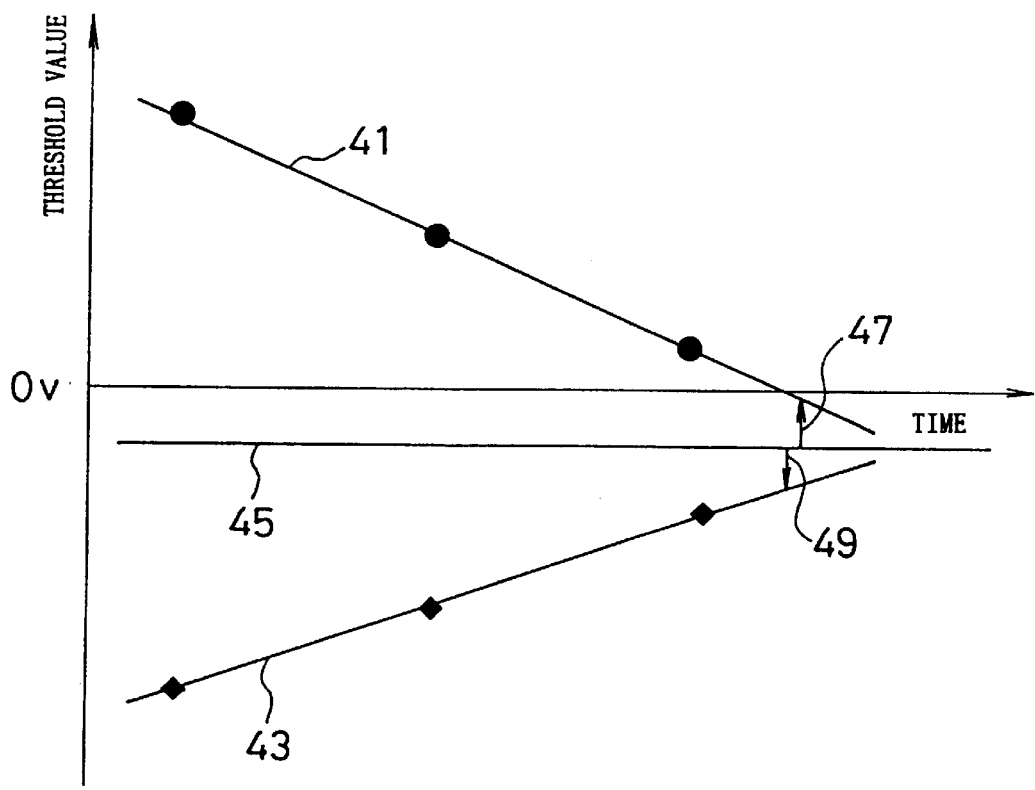
FIG. 3 is a graph which shows an example of the lowered condition of stored data in a non-volatile semiconductor memory device of the past, which illustrates the operation of the differential amplifier circuit.

FIG. 2 is a graph that shows the time variation characteristic of a programmed memory threshold voltage, while data is programmed in the memory in the above-noted example of the present invention. Because of changes with the passage of time, both the curve 71 which shows the time-variation characteristics of a memory threshold voltage that is enhancement-programmed, and the curve 73 which shows the time-variation characteristics of a memory threshold voltage that is depression-programmed approach the threshold voltage value 45 of the memory at the time of fabrication of the memory.

Because the signal voltage values from the first memory matrix array 13 and second memory matrix array 53, which is input to the differential sense amplifier circuit 23 are necessarily opposite-phase data, the differential sense amplifier circuit 23 amplifies the threshold voltage difference 77 of this opposite-phase data, and sends this to the data input/output switching circuit 29.

Figure 4:
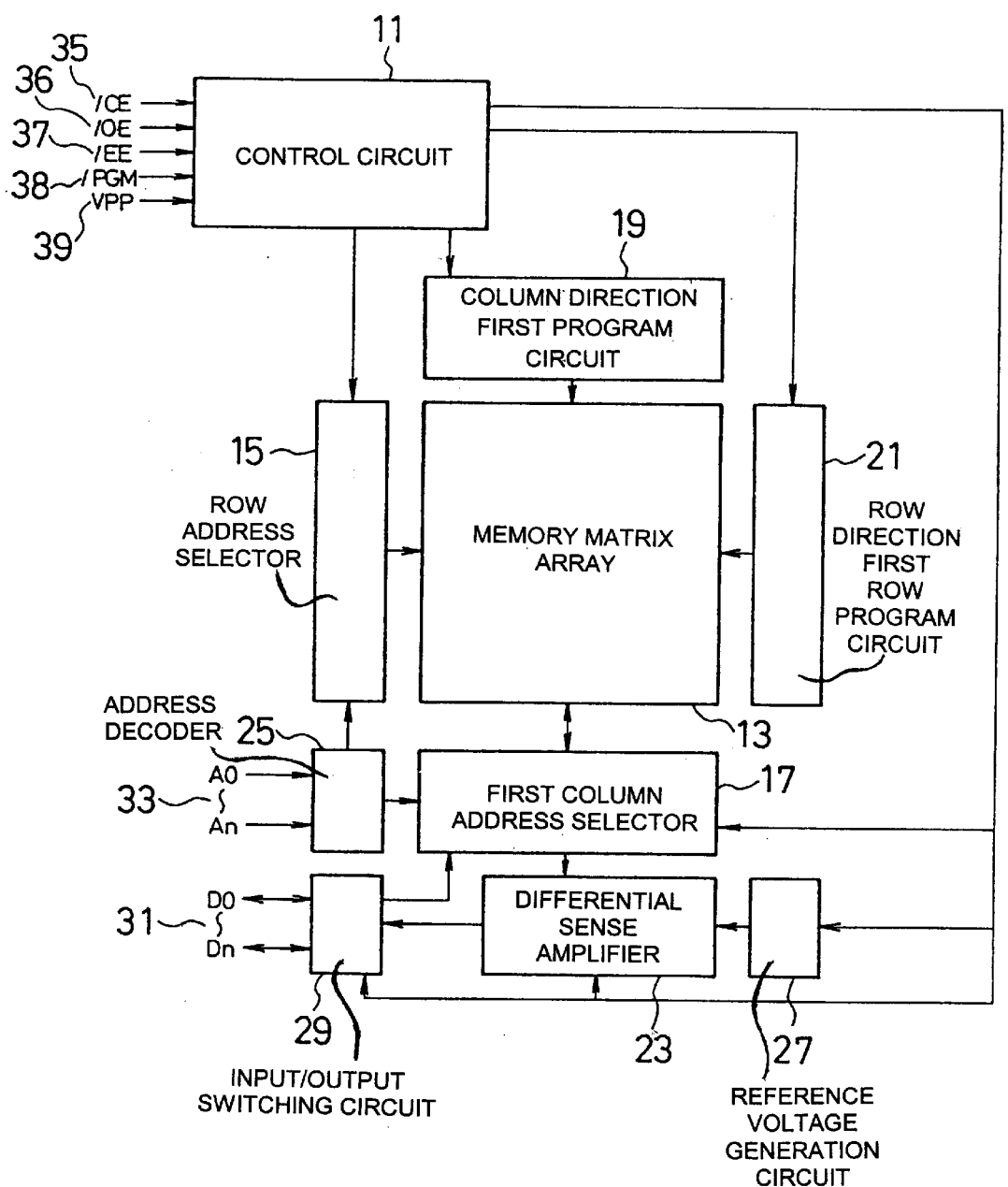
FIG. 4 is a block diagram which illustrates an example of the circuit configuration of a non-volatile semiconductor memory device of the past.
Figure 5:
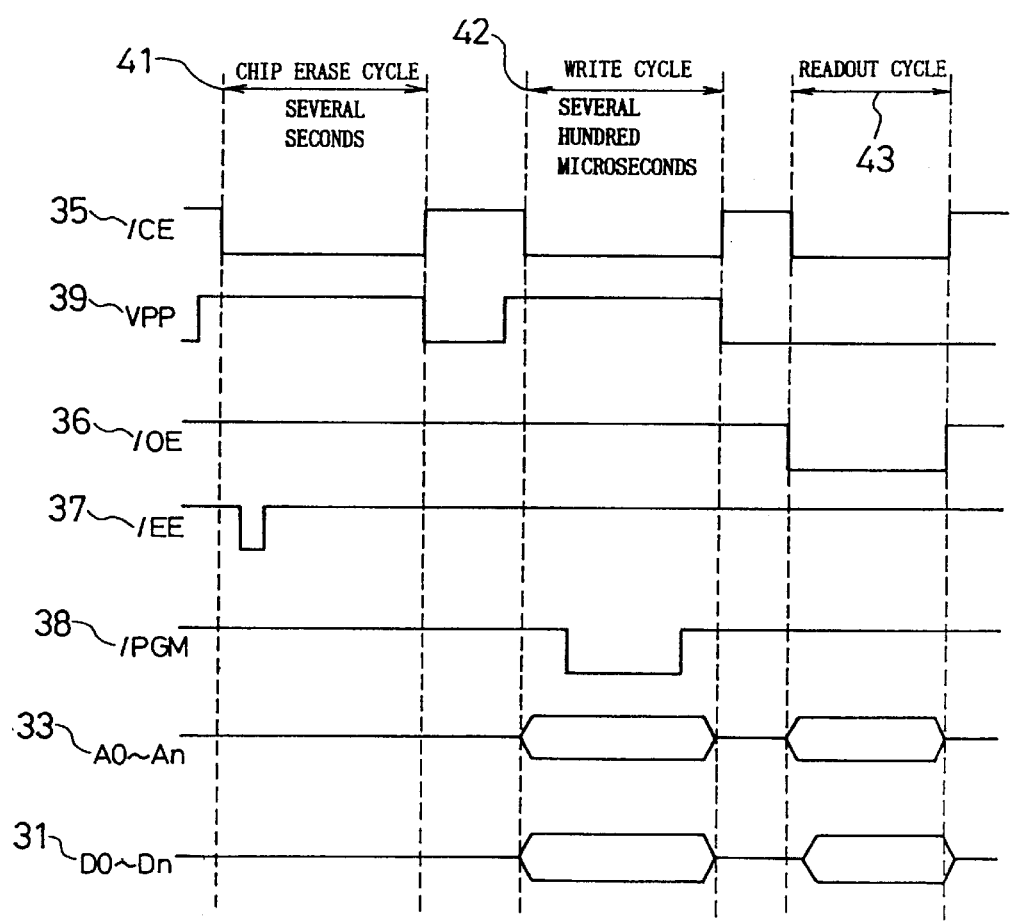
FIG. 5 is a drawing which illustrates an example of the timing of operation in a non-volatile semiconductor memory device of the past.

In general, the greater is the difference between compared signals input to the sense amplifier circuit 23, the faster will be the operation of the differential sense amplifier circuit 23. The input potential difference 77 that is input to the differential sense amplifier circuit 23 in a non-volatile semiconductor memory device according to the present invention is double the input potential difference 17 that is input to the differential sense amplifier circuit 23 of the non-volatile semiconductor memory device of the past shown in FIG. 4, so that the differential sense amplifier circuit in the non-volatile semiconductor memory device according to the present invention operates faster than the differential sense amplifier circuit in a non-volatile semiconductor memory device of the past.

Therefore, in the first example of a non-volatile semiconductor memory device according to the present invention, by providing a first and a second memory matrix array which have exactly the same configuration, and by programming opposite-phase data into each of these memory matrix arrays and reading out this memory data using a differential amplifier circuit, it is possible to operate the differential amplifier circuit at high speed even if there is variation with the passage of time, this enabling the achievement of a non-volatile semiconductor memory device capable of high-speed readout.

In addition, by providing a first and a second memory matrix array which have exactly the same configuration and programming opposite-phase data into these respective memory matrix arrays, and by reading out this memory data using a differential amplifier circuit, it is possible to provide a non-volatile semiconductor memory device that is capable of operating a differential sense amplifier circuit stably over long periods of time, even if there is change with the passage of time.

Next, the configuration and operation of a second example of a non-volatile semiconductor memory device according to the present invention will be described, with reference being made to FIG. 6 through FIG. 8.

Specifically, a non-volatile semiconductor memory device 200 according to the second example of the present invention is an electrically rewritable non-volatile semiconductor memory device, this having a characteristic non-volatile semiconductor memory device circuit configuration and method of programming data into a memory array. In particular, this example relates to an electrically rewritable non-volatile semiconductor memory device 200 that is suitable for use in a data storage system that is required to write data at high speed.

Figure 6:
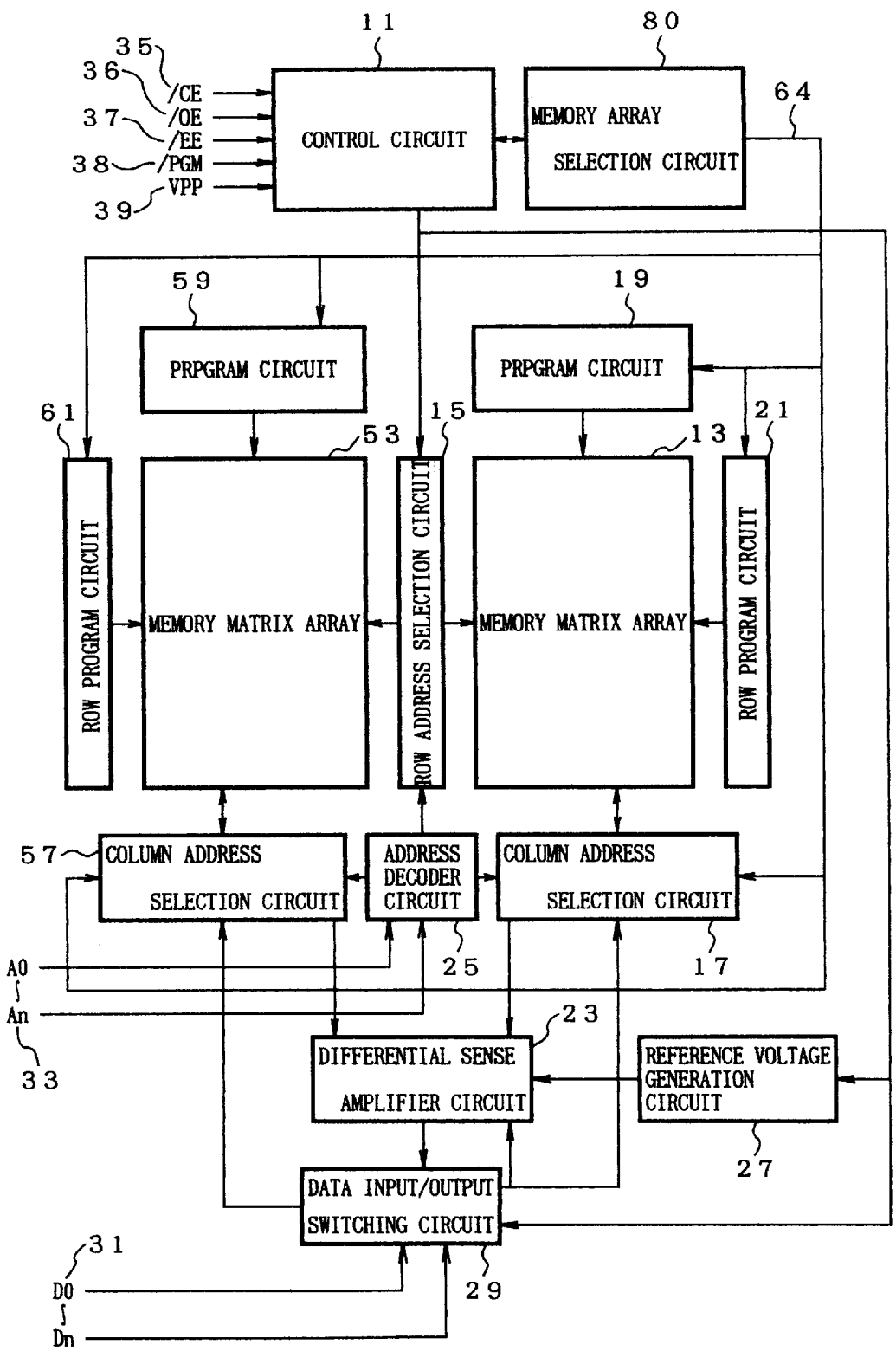
FIG. 6 is a block diagram which shows the configuration of a non-volatile semiconductor memory device according to the second aspect of an embodiment of the present invention.

FIG. 6 shows the configuration of a non-volatile semiconductor memory device 200 according to the second example of the present invention, this being a non-volatile semiconductor memory device that has an electrically programmable memory matrix array, this memory matrix array being a first non-volatile semiconductor memory matrix array 13 and a second non-volatile semiconductor memory matrix array 53 that has the same construction as the first non-volatile semiconductor memory matrix array 13.

This semiconductor memory device further has a memory matrix array selection circuit 80 which is connected in common to the first memory matrix array 13 and the second memory matrix array 53, and in response to a selection control signal that is output from a control circuit 11, this memory matrix array selection circuit 80 issues a command to erase data of one of the non-volatile semiconductor memory matrix arrays, for example 13, and simultaneously issues a command to write into the other non-volatile semiconductor memory matrix array, for example 53.

That is, the second example of the present invention has a first non-volatile semiconductor memory matrix array 13 capable of being electrical written with data, and another second memory matrix array 53 having memory cells of the exact same construction as the first memory matrix array 13, this example also having a memory matrix array selection circuit 80, which selects the above-noted first and second non-volatile semiconductor memory matrix arrays 13 and 53, so that during the erasing of data of one memory matrix array 13, for example, data is written into the other memory matrix array 53, thus providing a non-volatile semiconductor memory device that is capable of performing the erasing and writing operations simultaneously, and capable of shortening the time to process data.

In the non-volatile semiconductor memory device 200 according to this example of the present invention, it is desirable that the memory matrix array selection circuit 80 use an electrically rewritable non-volatile semiconductor memory cell.

That is, in the second example of the present invention, simultaneously with the execution of erasure of data from one of the memory matrix arrays, execution is performed of writing into the other memory matrix array, and because alternating change is made between the first and second memory matrix arrays 13 and 53, it is necessary for the non-volatile semiconductor memory device itself to constantly remember which of the first and second memory matrix array 13 or 53 is selected for erasure and which is selected for writing.

Therefore, in the non-volatile semiconductor memory device 200 according to this example, as noted above, a non-volatile memory circuit is provided with the memory matrix array selection circuit 80, so that even if the power supply is turned off temporarily, the selection information is not lost, and when the power supply is turned on once again, the previous selection information is used to execute the appropriate processing.

That is, in this example of the present invention, it is desirable that a non-volatile semiconductor memory device element be used in the memory matrix array selection circuit 80 that has the same structure as is used in the first and second non-volatile semiconductor memory matrix arrays which are capable of electrical rewriting of data.

By using this configuration, the fabrication process for the non-volatile semiconductor memory device can be simplified.

The it is desirable that at least one bit of a memory cell that is used in the memory matrix array selection circuit 80 and has the same structure as used in the first and second electrically rewritable non-volatile semiconductor memory matrix arrays 13 and 53 in the memory matrix array selection circuit 80 is provided, and further that this memory cell be a memory cell that has a transistor size that is the same as used in the first and second non-volatile semiconductor memory matrix arrays.

Furthermore, in this example, it is necessary not only to have one bit of a memory cell that has the same structure as used in the first and second memory matrix arrays 13, 53 used in the above-noted memory matrix array selection circuit 80 and that has the same transistor size used therein, but also to separate and force the above-noted memory cell to be independent from the first and second non-volatile semiconductor memory matrix arrays 13 and 53.

Figure 9:
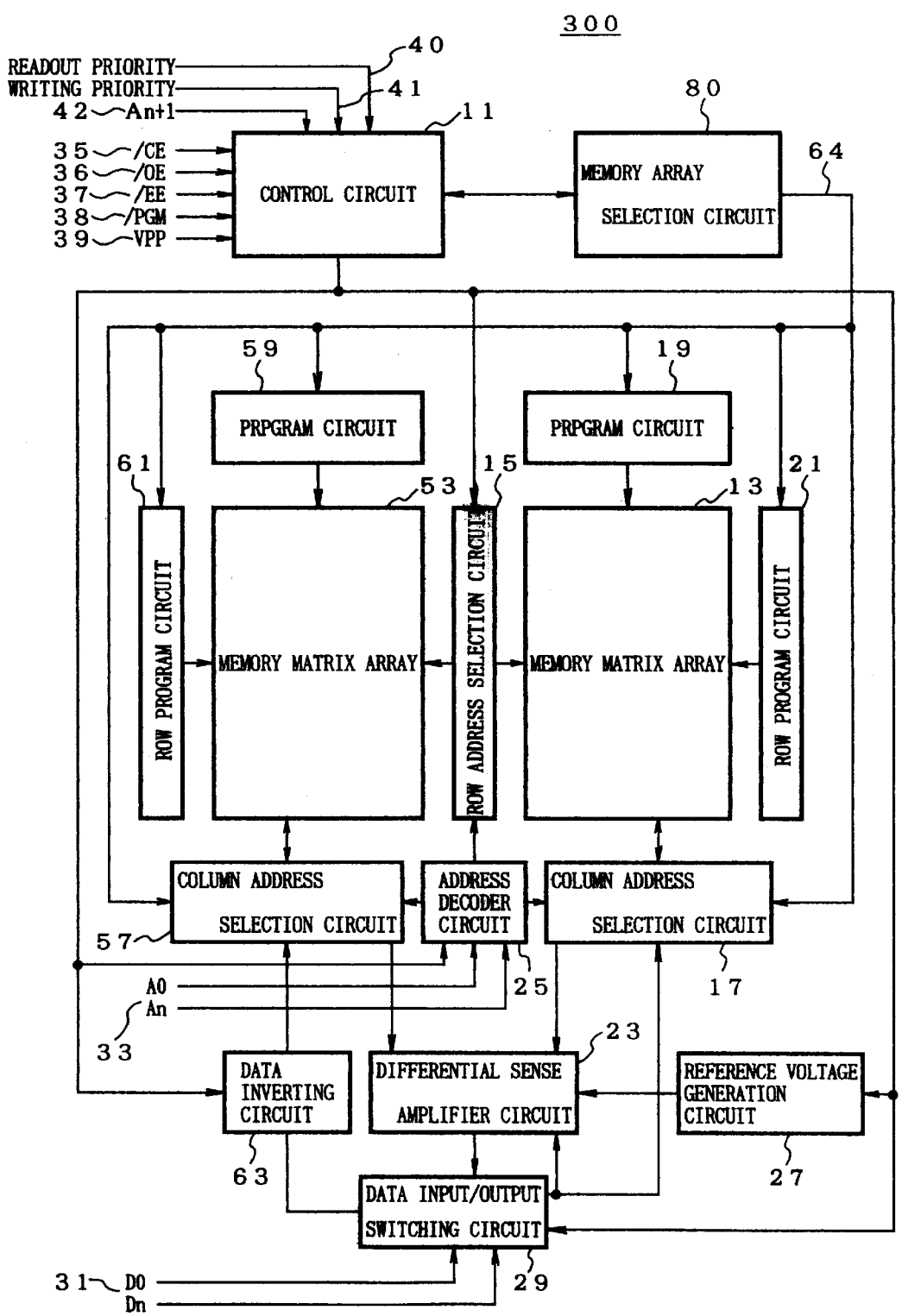
FIG. 9 is a block diagram which shows the configuration of a non-volatile semiconductor memory device according to the third aspect of an embodiment of the present invention.

It is also desirable that the memory cell that has the same structure and transistor size as used in the first and second non-volatile semiconductor memory matrix arrays 13 and 53 provided in the memory matrix array selection circuit 80, as noted above, be a MONOS-type semiconductor storage element as shown in FIG. 9.

The operation of this example of the non-volatile semiconductor memory device 200 will be described in detail below.

The general configuration of the second example of the non-volatile semiconductor memory device 200 according to the present invention is, as shown in FIG. 6, basically the same as the first example which is shown in FIG. 1, with the difference that in this example there is the addition of the above-noted memory matrix array selection circuit 80, and that a reference voltage generation circuit 27 for generating a reference voltage, which was used in a non-volatile semiconductor memory device of the past, and a means for comparing the reference voltage, with a data voltage readout from each memory are provided in the differential sense amplifier circuit 23 (not shown in the drawing).

In particular in this example, the control circuit 11 has input to it the chip enable signal /CE 35, the data output enable signal /OE 36, the chip erase enable signal /EE 37, the program enable signal /PGM 38, and the program high-voltage signal VPP 39, these being directly used in the operation of this example.

That is, in the second example of the present invention which is shown in FIG. 6, the electrically rewritable non-volatile semiconductor memory device 200 has a first memory matrix array 13, and a second memory matrix array 53, which has a structure that is exactly the same as the first memory matrix array 13.

Also, this example of the non-volatile semiconductor memory device 200 has a control circuit 11, a row address selection circuit 15, a first column address selection circuit 17, a second column address selection circuit 57, a column direction first program circuit 19, a column direction second program circuit 59, a row direction first row program circuit 21, a row direction second row program circuit 61, a differential sense amplifier circuit 23, an address decoder circuit 25, a data input/output switching circuit 29, a reference voltage generation circuit 27, and a memory matrix array selection circuit 80.

The first column address selection circuit 17 has exactly the same circuit configuration as the second column address selection circuit 57. The first column direction program circuit 19 has exactly the same circuit configuration has the second column direction program circuit 59.

The row direction first row program circuit 21 has exactly the same circuit configuration as the second row program circuit 61.

The control circuit 11 is connected to the memory matrix array selection circuit 80, the row address selection circuit 15, the reference voltage generation circuit 27, and the data input/output switching circuit 29.

The memory array selection signal 64, which is an output of the memory matrix array selection circuit 80, is connected to the first program circuit 19, the first row program circuit 21, the first column address selection circuit 17, the second program circuit 59, the second row program circuit 61, and the second column address selection circuit 57.

The address decoder circuit 25 is connected to the first column address selection circuit 17, the second column address selection circuit 57, and the row address selection circuit 15, and the row address selection circuit 15 is connected to the first memory matrix array 13 and the second memory matrix array 53.

Additionally, the first program circuit 19 is connected to the first memory matrix array 13, and the other second program circuit 59 is connected to the second memory matrix array 53.

The first row program circuit 21 is connected to the first memory matrix array 13, and the other, second row program circuit 61 is connected to the second memory matrix array 53.

The first column address selection circuit 17 is connected to the first memory matrix array 13 and the differential sense amplifier circuit 23, and the other, second column address selection circuit 57 is connected to the other, second memory matrix array 53 and to the differential sense amplifier circuit 23. Additionally, the differential sense amplifier circuit 23 is connected to the data input/output switching circuit 29.

The data input/output switching circuit 29 is connected to the first column address selection circuit 17 and top the other, second column address selection circuit 57. The reference voltage generation circuit 27 is connected to the differential sense amplifier circuit 23.

Next, the configuration of the memory matrix array selection circuit 80 in the non-volatile semiconductor memory device 200 of this example shown in FIG. 6 will be described, using FIG. 7.

Figure 7:
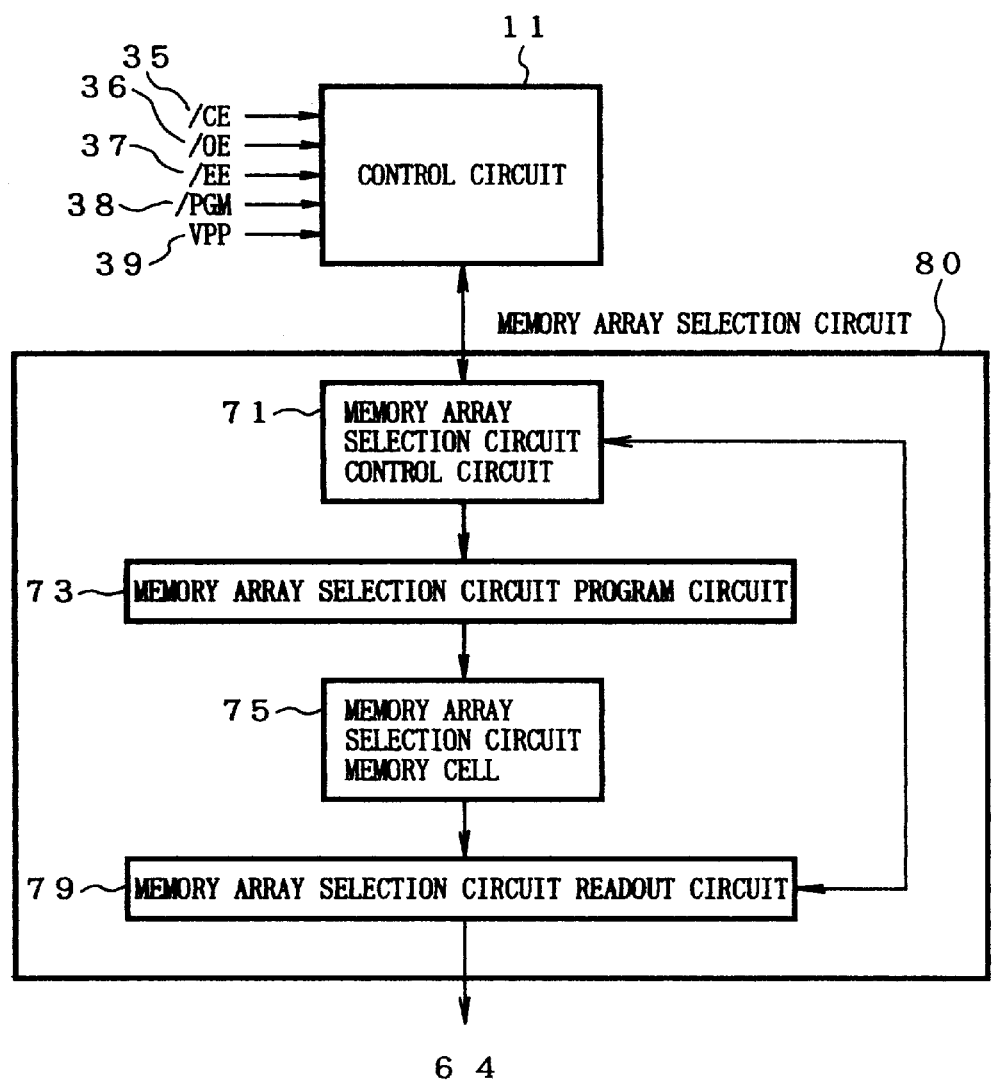
FIG. 7 is a drawing which illustrates an example of the configuration of a memory selection circuit of a non-volatile semiconductor memory device according to the second aspect of an embodiment of the present invention.

FIG. 7 is a circuit diagram which illustrates the configuration of the memory matrix array selection circuit 80 of the non-volatile semiconductor memory device 200 according to the present invention.

The memory matrix array selection circuit 80 is formed by a memory selection circuit control circuit 71, a memory array selection circuit program circuit 73, a 1-bit memory cell 75, and a readout circuit 79.

In this example of the present invention, the 1-bit memory cell 75 has the same construction as the memory cell transistor that is used to form the first and second memory matrix arrays 13 and 52 of the non-volatile semiconductor memory device 200 shown in FIG. 6, and also uses the same transistor size and memory cell structure.

The 1-bit memory cell 75 is completely separated from and independent with respect to the first memory matrix array 13 and the second memory matrix array 53 of the non-volatile semiconductor memory device 200 which is shown FIG. 6.

Next, the program operation of the second example of the present invention will be described, using FIG. 6, which shows the configuration of an embodiment of a non-volatile semiconductor memory device according to the present invention, FIG. 7, which shows the configuration of a memory selection circuit of an embodiment of a non-volatile semiconductor memory device according to the present invention, and FIG. 8, which shows the program timing.

First, the chip erase operational timing will be described, using FIG. 8, which shows the program timing. As shown in the chip erase cycle 41 of FIG. 8, in order to erase all of the memory of either the first memory matrix array 13 or the second memory matrix array 53, the chip enable signal /CE 35 is set to low level, the program high-voltage signal VPP 39 is set to the high-voltage high level, the data output enable signal /OE 36 is set to the high level, the chip erase enable signal /EE 37 is set to the low level, and the program enable signal /PGM 38 is set to the high level. The above-noted settings set the chip erase cycle 41, the data in all of the memory of either the first memory matrix array 13 or the second memory matrix array 53 being erased during several seconds of the chip erase cycle 41.

The circuit operation will be described next, using FIG. 6 and FIG. 7.

With regard to signals that are input to the non-volatile semiconductor memory device, when the program high-voltage signal VPP 39 changes to the high-voltage high level, and the chip enable signal /CE 35 changes to the low level, the data of the memory cell 75 of the memory selection circuit 80 is read out to the readout circuit 79 of the memory selection circuit 80.

Additionally, when the chip erase enable signal /EE 37 changes to the low level, the control circuit 11 starts the chip erase cycle 41, whereupon if the data read out to the readout circuit 79 is the high level, which is the erased condition, the memory array selection signal 64, which performs data erasure of the first memory matrix array 13 is output from the memory matrix array selection circuit 80 and sent to the first column direction program circuit 19, the first row program circuit 21, and the column address selection circuit 17, whereby the first memory matrix array 13 being placed in the erased condition.

Additionally, if the data read out to the readout circuit 79 is low level, which is the write condition, the program circuit 73 of the memory matrix array selection circuit 80 erases the memory cell 75 as well, with the same timing as the erasure of the first memory matrix array 13.

If the data read out to the readout circuit 79 is low level, which is the data write condition, the memory array selection signal 64, which performs erasure of the second memory matrix array 53 is output from the memory array selection circuit 80 and sent to the second column direction program circuit 59, the second row program circuit 61, and the column address selection circuit 57, the second memory matrix array 53 being placed in the erased condition.

Additionally, with the same timing as the above-described erasure of the second memory matrix array 53, memory data of the memory cell 75 is erased by the program circuit 73 of the memory matrix selection circuit 80.

The control circuit 11 maintains the chip enable signal 41 for several seconds, and several seconds later sends a signal that ends the chip enable signal 41 to the row address selection circuit 15, the first column address selection circuit 17, the first program circuit 19, and the first row program circuit 21 in the case of erasing the first memory matrix array 13, and sends a signal that ends the chip erase cycle 41 to the row address selection circuit 15, the second column address selection circuit 57, the second program circuit 59, and the row program circuit 61 in the case of erasing the second memory matrix array 53, thereby ending the erasing operation.

In the above-described chip erase cycle 41, only either one of the first memory matrix array 13 or the second memory matrix array 53 is performing the erasing operation, and in an erase cycle 41 which erases the first memory matrix array 13, the other, second memory matrix array 53 is already in the erased condition, in which it can be written into immediately.

In an erase cycle 41 of the second memory matrix array 53, the other, first memory matrix array 13 is already in the erased condition, in which it can be written into immediately.

That is, during execution of the erase cycle 41 for the first memory matrix array 13, it is possible to start writing to the second memory matrix array 53, and during the erase cycle 41 for the second memory matrix array 53, it is possible to start writing to the first memory matrix array 13. Essentially, once the erase enable signal /EE 37 changes from low level to high level, it is possible to start a write cycle 42, without waiting for the end of the erase cycle 41.

Figure 8:
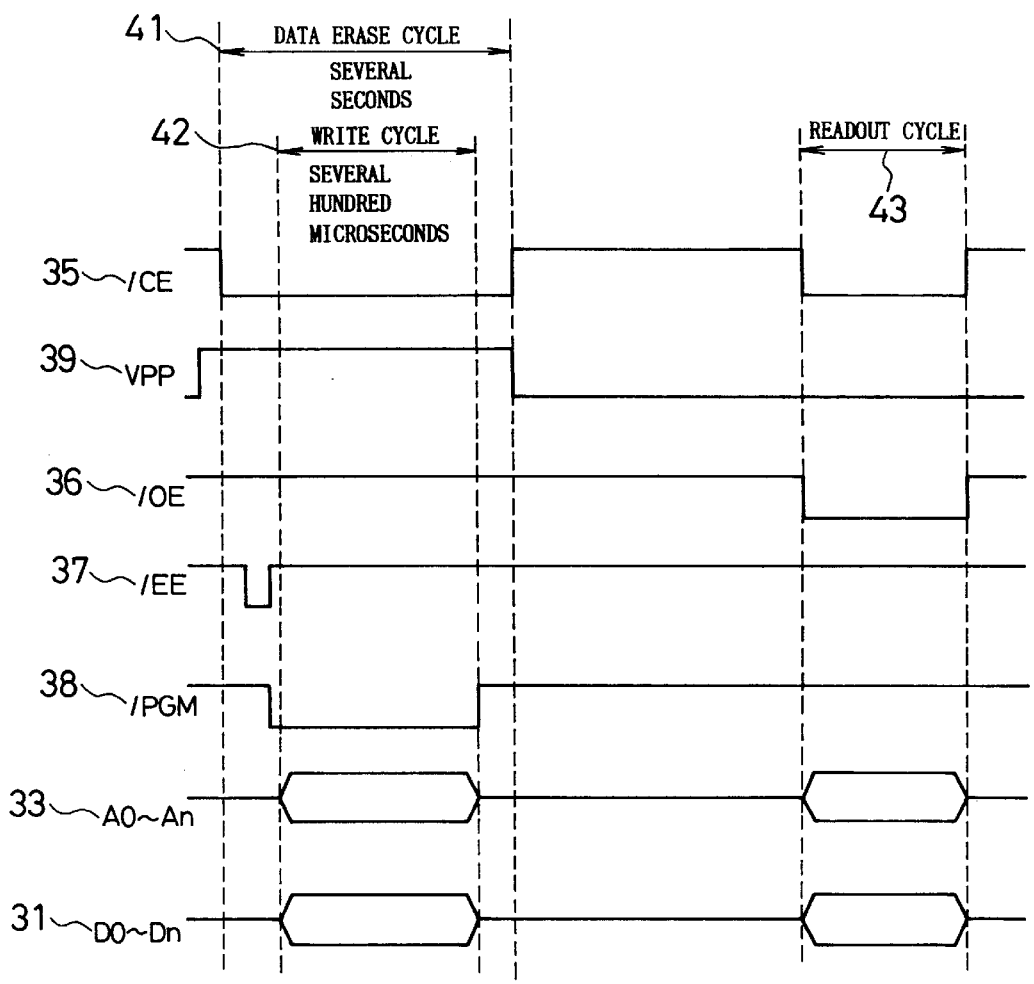
FIG. 8 is a drawing which illustrates an example of the timing of operation in a non-volatile semiconductor memory device according to the second aspect of an embodiment of the present invention.

Next, the operational timing of data writing will be described, using the program timing which is shown in FIG. 8.

As shown by the write cycle 42 of FIG. 8, in order to write to the first memory matrix array 13 or the second memory matrix array 53, the chip enable signal /CE 35 is set to the low level, the program high-voltage signal VPP 39 is set to the high-voltage high level, the data output enable signal /OE 36 is set to the high level, the chip erase enable signal /EE 37 is set to the high level, and the program enable signal /PGM 38 is set to the low level. The address signals A0 through An 33 are input, as are the data D0 through Dn 31.

By the above-noted settings, the write cycle 42 is set, the data input as D0 through Dn 31 being written into an address in either the first memory matrix array 13 or the second memory matrix array 53, which is set by the input address A0 through An 33 during a period of several hundreds microseconds in the write cycle 42.

The circuit operation will be explained, using FIG. 6 and FIG. 7.

With regard to signals that are input to the non-volatile semiconductor memory device, when the program high-voltage signal VPP 39 changes to the high-voltage high level and the chip enable signal /CE 35 changes to the low level, the data of the memory cell 75 of the memory selection circuit 80 is read out to the readout circuit 79 of the memory selection circuit 80.

Additionally, when the erase signal /EE changes from low level to high level, after the memory matrix array 13 or the memory matrix array 53 goes into the erase mode, when the program enable signal /PGM 38 changes to the low level, the control circuit 11 starts the write cycle 42, whereupon if the data read out to the readout circuit 79 is high level, which is the erase condition, a signal that writes data into the second memory matrix array 53, the memory array selection signal 64 is output from the memory array selection circuit 80, this being sent to the second column direction program circuit 59, the second row program circuit 61, and the column address selection circuit 57, and writing of data to the second memory matrix array 53 starts.

Simultaneously with the above, writing to the memory array selection circuit memory cell 75 of the memory matrix array selection circuit 80 also starts.

If the erase signal /EE changes from low level to high level, after the memory array 13 or the memory array 53 goes into the erase mode, the program enable signal /PGM 38 changes to low level and the control circuit 11 starts the write cycle 42, and if the data read out to the readout circuit 79 is low level, which is the write condition, a signal that writes data to the first memory matrix array 13 is output as the memory array selection signal from the memory matrix array selection circuit 80, this being sent to the first column direction program circuit 19, the first row program circuit 21, and the column address selection circuit 17, whereupon the writing of data to the first memory matrix array 13 starts.

The control circuit 11 maintains the write cycle 42 for several microseconds. Then, in the case of writing data to the first memory matrix array 13, after several microseconds, a signal that ends the write cycle 42 is sent to the row address selection circuit 15, the first column address selection circuit 17, the first program circuit 19, and the first row program circuit 21.

In the case of writing data to the second memory matrix array 53, after several microseconds, a signal that ends the write cycle is sent to the row address selection circuit 15, the second column address selection circuit 57, the second program circuit 59, and the second row program circuit 61.

Finally, the data readout operation will be described, using the circuit configuration of FIG. 6, the configuration of the memory selection circuit shown in FIG. 7, and the operational timing diagram of FIG. 8.

First, the operational timing of the readout operation will be described, using the program timing which is shown in FIG. 8. As shown by the write cycle 42 of FIG. 8, in order to read out the data of either the first memory matrix array 13 or the second memory matrix array 53, the chip enable signal /CE 35 is set to the low level, the program high-voltage signal VPP 39 is set to the low level, the data output enable signal /OE 36 is set to the low level, the chip erase enable signal /EE 37 is set to the high level, the program enable signal /PGM 38 is set to the high level, and the address signals A0 through An 33 are input.

By the above-noted settings, the data D0 through Dn 31 of an address selected by the address signals A0 through An 33 in either the first memory matrix array 13 or the second memory matrix array 53 is output.

The circuit operation will be described using FIG. 6 and FIG. 7. With regard to the signals input to the non-volatile semiconductor memory device, when the chip enable signal /CE 35 changes to the low level and the output enable signal /OE 36 changes to the low level, the data of the memory cell 75 of the memory selection circuit 80 is read out to the readout circuit 79 of the memory selection circuit 80.

If the data read out to the readout circuit 79 is the low level, which is the write condition, a memory array selection signal 64, which reads out to the second memory matrix array 53 is output from the memory array selection circuit 80, this being sent to the column address selection circuit 57, whereupon the data readout from the second memory matrix array 53 starts.

The read out data that is sent to the column address selection circuit 57 is sent to the differential sense amplifier circuit 23, it is compared with a signal from the reference voltage generation circuit 27, sent to the data input/output switching circuit 29, and output as D0 through Dn 31.

If the data that is read out to the readout circuit 79 is the high level, which is the write condition, a memory array selection signal 64 that reads out to the first memory matrix array 13 is output from the memory array selection circuit 80, this is sent to the column address selection circuit 17, and the readout of data from the second memory matrix array 53 starts.

The read out data that is sent to the column address selection circuit 17 is sent to the differential sense amplifier circuit 23, compared with a signal from the reference voltage generation circuit 27, this is sent to the data input/output switching circuit 29, and is output as D0 through Dn 31.

The above-noted second example of the present invention has two memory matrix arrays with the exact same configuration and the same memory cells, and has a memory array selection circuit with an electrically rewritable non-volatile memory cell, the data of this memory array selection circuit enabling the writing into one memory matrix array while erasing the other memory matrix array, thereby providing an electrically rewritable non-volatile semiconductor memory device capable of high-speed rewriting of data.

By providing two memory matrix arrays having the exact same configuration and using the same memory cell and a memory array selection circuit that has an electrically rewritable non-volatile memory cell, the memory array selection circuit using a memory cell that has the same construction as in the memory matrix array, it is possible to use this memory cell data to enable the writing into one memory matrix array while erasing is being performed on the other memory matrix array, without increasing the number of fabrication steps, thereby enabling the provision of an electrically rewritable non-volatile semiconductor memory device that is capable of data rewriting at a high speed.

By providing two memory matrix arrays having the exact same configuration and an memory array selection circuit that has an electrically rewritable non-volatile memory cell, with this memory array selection circuit using a 1-bit memory cell having the same construction as used in the memory matrix array, it is possible by means of the data of this memory cell to write into one memory matrix array simultaneously with the erasure of the other memory matrix array, without increasing the fabrication process steps and without increasing the chip surface area, thus enabling the provision of an electrically rewritable non-volatile semiconductor memory device that is capable of data rewriting at a high speed.

Next, the configuration a specific example of a non-volatile semiconductor memory device 300 according to the third aspect of an embodiment of the present invention will be described in detail, with reference made to FIG. 9 through FIG. 11.

Specifically, this example of a non-volatile semiconductor memory device is a combination of the above-described first and second examples, this non-volatile semiconductor memory device 300 enabling not only high-speed data readout, but also appropriate selection of either a mode that enables long-term storage of data or a mode that provides high-speed writing of data.

FIG. 9 shows a semiconductor memory device that is a non-volatile semiconductor memory device which has an electrically rewritable memory matrix array, this memory matrix array being a first non-volatile semiconductor memory matrix array 13 and a second non-volatile semiconductor memory matrix array 53 that has the same structure as the first non-volatile semiconductor memory matrix array 13, the memory device further having an input data inverting circuit 63, which is connected to the second non-volatile semiconductor memory matrix array for the purpose of programming inverted data of the first non-volatile semiconductor memory matrix array 13, a differential sense amplifier circuit 23, which is connected to both the first non-volatile semiconductor memory matrix array 13 data and the second non-volatile semiconductor memory matrix array 53, for the purpose of reading out data of the first and second non-volatile semiconductor memory matrix arrays 13 and 53, and a memory matrix array selection circuit 80 that is configured so as to select either the first or second non-volatile semiconductor memory matrix arrays 13 and 53 or both of these arrays.

That is, the third example of the present invention is configured by linking the configurations of the non-volatile semiconductor memory device which are shown in FIG. 1 and FIG. 6, and for that reason the control circuit 11 is newly configured so as to input a selection signal that selects a specific operating mode.

For example, as noted above, input is made of, for example, mode selection signal 40 that selects a mode giving priority to high-speed data readout, or a mode selection signal 41 that selects a mode giving priority to high-speed writing of data.

That is, in the non-volatile semiconductor memory device 300 according to the third example of the present invention, there is minimally further provided a control circuit 11 which controls the memory matrix array selection circuit 80, the input data inverting circuit 63, and the differential sense amplifier circuit 23, by using a mode selection signal such as indicated in the above-noted example.

If, for example in the case of the first example of the present invention, data having different polarity is input to one and the same addresses of the first and second memory matrix arrays 13 and 53, this being read out using a differential sense amplifier circuit, it becomes unnecessary to have a comparison circuit to make a comparison with respect to a reference voltage and unnecessary to perform the comparison operation as in the past, this operation condition being known as data readout speed-priority mode and resulting this system being effective to store and hold the data for long time so this operation aspect can be called as a read out priority mode.

When this mode is selected, the data writing operation it is necessary to perform the operation of inputting data of different polarity to the same addresses, using the first and second memory matrix arrays 13 and 53.

In contrast to the above, in the case of the second example of the present invention, the first and second memory matrix arrays 13 and 53 are used, the data writing operation and the data erasing operation being executed in one of the memory matrix arrays 13 during one operating time, so that during one and the same operating time period, data reading out operation is performed in other memory matrix array 53, there is caused to be a substantial overlap of the erasing time and the writing time, thereby shortening the time for writing, this operating condition being called the program time-priority mode.

When this mode is selected, data writing/erasing and data readout are performed alternately in the first and second memory matrix arrays 13 and 53.

In addition, there is also a memory capacity-priority mode in which the first and second memory matrix arrays 13 and 53 are used directly to double the storage memory capacity.

In the above readout-priority mode in particular, the data readout-priority mode selection signal 40 is the high level and the data writing-priority mode selection signal 41 is the low level, after setting the data readout-priority mode, a signal from the control circuit 11 causes the data inverting circuit 63 to operate, an stops the reference voltage generation circuit 27.

Simultaneously, the memory matrix array selection circuit 80 is stopped, thereby starting the inverted data writing operation and speeding up the data readout.

In contrast to the above, with the data readout-priority mode selection signal 40 at the low level, if the data writing-priority mode selection signal 41 changes to the high level, the writing-priority mode is enabled, a signal from the control circuit 11 stopping the operation of the data inverting circuit 63, the signal from the data input/output switching circuit 29 being output as is to the column address signal selection circuit 57.

Simultaneously with the above, the reference voltage generation circuit 27 is caused to operate, as is the memory matrix array selection circuit 80, this operation not requiring the erasing time.

In the case in which the data readout-priority mode selection signal 40 and the data writing-priority mode selection signal are both at the low level, the memory capacity-priority mode is enabled.

That is, by means of the signal from the control circuit 11, the data inverting circuit 63 is stopped, and the signal from the data input/output circuit 29 is output as is to the column address signal selection circuit 57.

Simultaneously with causing the reference voltage generation circuit 27 to operate, the memory matrix array selection circuit 80 is stopped.

In this mode, by inputting the An+1 address signal into the address selection circuit 25 by means of the control circuit 11, the two memory matrix arrays 13 and 53 are used, and this doubles the memory capacity.

Figure 10:
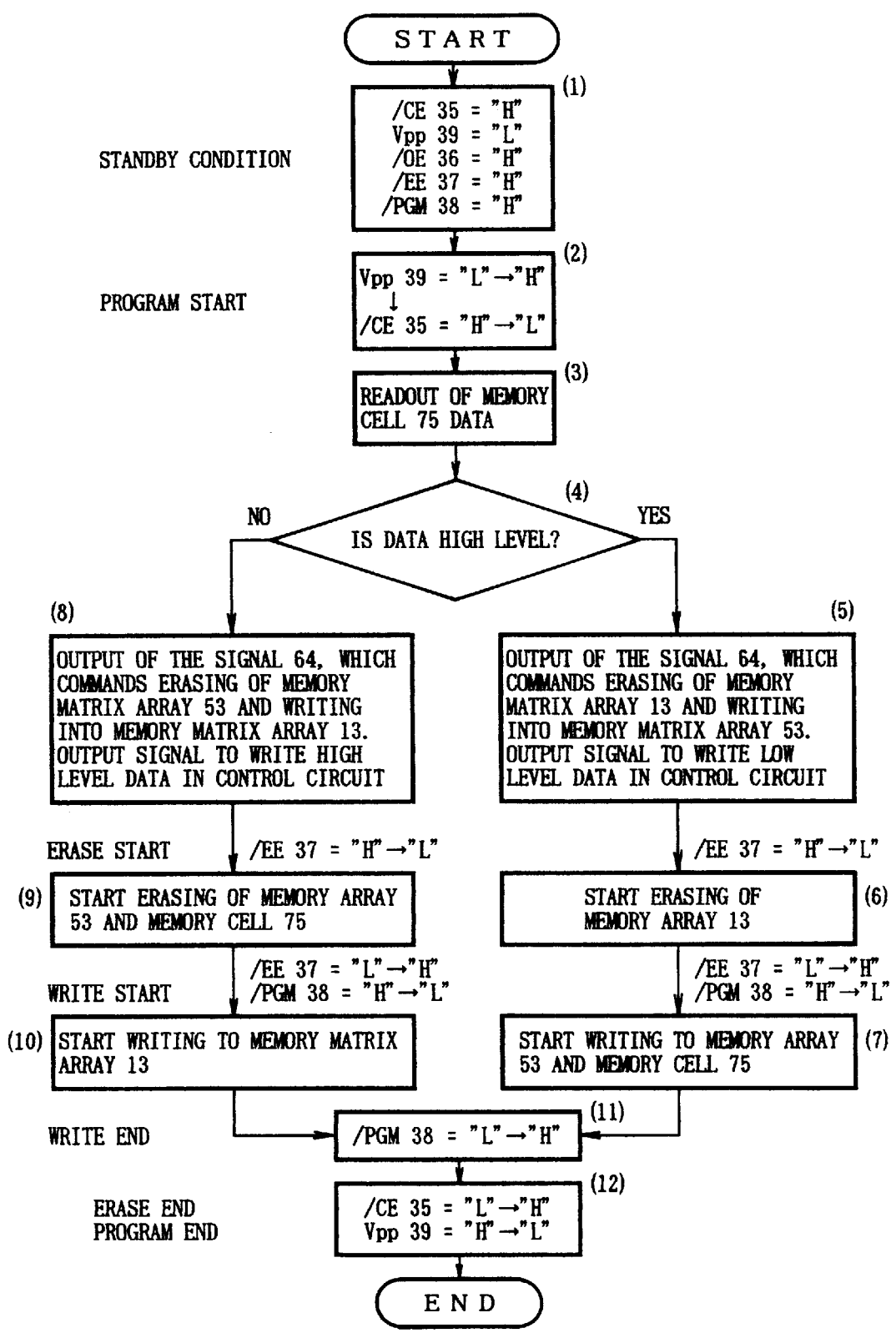
FIG. 10 is a flowchart which shows an example of the programming operation used in a non-volatile semiconductor memory device according to the third aspect of an embodiment of the present invention.
Figure 11:
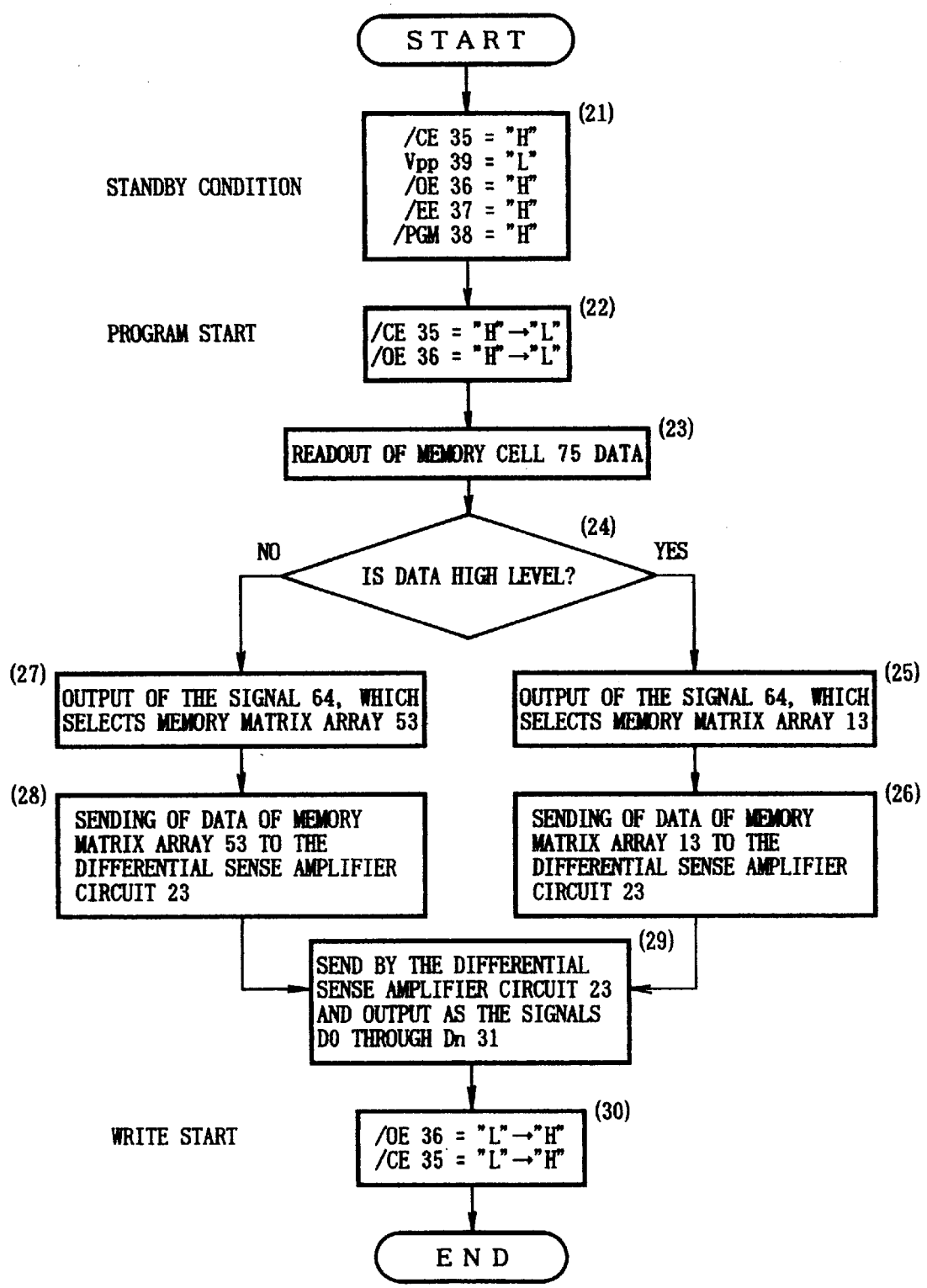
FIG. 11 is a flowchart which shows an example of the readout operation in a non-volatile semiconductor memory device according to the third aspect of the present invention.

Next, various mode selections and operation in the third example of the present invention will be summarized, with reference being made to the flowchart of FIG. 10 and FIG. 11, and the timing chart of FIG. 8.

Specifically, FIG. 10 and FIG. 11 are flowchart which illustrate the operational procedure in the third example of the present invention, which uses the non-volatile semiconductor memory device 300 which is shown in FIG. 9.

FIG. 10 is a flowchart that shows an example of the data erasing, writing, and programming operations in the above-noted example.

After starting, step (1) is the standby condition and, as is clear from FIG. 8, the settings are made of the chip enable signal /CE 35 to the high level, the program high-voltage signal VPP 39 to the low level, the data output enable signal /OE 36 to the high level, the chip erase enable signal /EE 37 to the high level, and the program enable signal /PGM 38 to the high level.

Next, proceeding to step (2), the program high-voltage signal VPP 39 is changed from the low level to the high level, a slight delay after which the chip enable signal /CE 35 is changed from the high level to the low level, this setting the program start condition.

Next, proceeding to step (3), the memory matrix array selection circuit memory cell 75 data for the memory array selection circuit 80 is read out.

If this memory matrix array selection circuit memory cell 75 data is priorly set to the high level, the first memory matrix array 13 is selected, and if it is priorly set to the low level, the second memory matrix array 53 is selected.

Then, proceeding to step (4), a control signal that is output from the memory matrix array selection circuit memory cell 75 is detected and, if this data is at the high level, flow proceeds to step (5), at which the data of the first memory matrix array 13 is erased, simultaneously with which a control signal 64 that issues an instruction to write data into the second memory matrix array 53 with the above-noted delayed timing is output from the memory matrix selection circuit 80.

Simultaneously with the above, memory matrix array selection circuit readout circuit 79 in the memory array selection circuit 80, a control signal is output to the memory matrix array memory matrix array selection circuit control circuit 71, thereby rewriting the current high level data stored in this memory array selection circuit control circuit 71 to the low level.

By doing this, in the following program operation priority selection is made of the neighboring second memory matrix array 53.

Then, proceeding to step (6), by changing the chip enable signal /EE 37 from the high level to the low level, the erase operation of the first memory matrix array 13 is started.

Next, proceeding to step (7), the chip enable signal /EE 37 is changed from the low level to the high level and the program enable signal /PGM 38 is changed from the high level to the low level, thereby starting the writing operation into the second memory matrix array 53 after completion of the erasing operation of the first memory matrix array 13.

Simultaneously with the above, low level data is also written into the memory matrix array selection circuit memory cell 75.

Then, moving on to step (11), by changing the program enable signal /PGM 38 from the low level to the high level, the write operation is ended, and at step (12) the chip enable signal /CE 35 is changed from the low level to the high level, and the program high-voltage signal VPP 39 is changed from the high level to the low level, thereby ending the erase operation and simultaneously ending the programming operation.

In contrast to the above, if at step (4) the control signal data that is output from the memory matrix array selection circuit memory cell 75 is at the low level, the flow proceeds to step (8), at which the data of the second memory matrix array 53 is erased and a control signal 64 that issues a command to write the prescribed data into the first memory matrix array 13 with the above-noted delayed timing is output from the memory array selection circuit 80.

Simultaneously with the above, from the memory array selection circuit readout circuit 79 of the memory matrix array selection circuit 80 a control signal is output to the memory array selection circuit control circuit 71, thereby rewriting low level data currently stored in the memory array selection circuit control circuit 71 to the high level.

Then, proceeding to step (9), by changing the chip enable signal /EE 37 from the high level to the low level, simultaneously starting is made of the first memory matrix array 13 erasing operation and the erasing operation of the memory matrix array selection circuit memory cell 75 data to the high level.

Next, proceeding to step (10), the chip erase enable signal /EE 37 is changed from the low level to the high level, and the program enable signal /PGM 38 is changed from the high level to the low level, thereby starting the writing into the first memory matrix array 13 immediately after the erasure of the second memory matrix array 53.

Thereafter, steps (11) and (12) are as described above.

FIG. 11 is a flowchart which shows an example of the programming operation that is performed for data readout in the above-noted example of the present invention.

After starting, step (21) is the standby condition and, as is clear from FIG. 8, the settings re made of the chip enable signal /CE 35 to the high level, the program high-voltage signal VPP 39 to the low level, the data output enable signal /OE 36 to the high level, the chip erase enable signal /EE 37 to the high level, and the program enable signal /PGM 38 to the high level.

Next, proceeding to step (22), the chip enable signal /CE 35 is changed from the high level to the low level, and the data output enable signal /OE 36 is changed from the high level to the low level.

Next, proceeding to step (23), data of the memory matrix array selection circuit memory cell 75 of the memory matrix array selection circuit 80 is read out.

Then, proceeding to step (24), a control signal that is output from the memory matrix array selection circuit memory cell 75 is detected and, if this data is at the high level, flow proceeds to step (25), at which the control signal 64 which issues a command to selects the first memory matrix array 13 is output from the memory array selection circuit 80.

Thereafter, the flow proceeds to step (26), at which the prescribed data is readout by the differential sense amplifier circuit 23 from a prescribed selected address in the first memory matrix array 13.

Next, proceeding to step (29), data which is read out from the differential sense amplifier circuit 23 is output as the data signals D0 through Dn via the data input/output switching circuit 29, after which at step (30) the chip enable signal /CE 35 is changed from the low level to the high level and the data output enable signal /OE 36 is changed from the low level to the high level, thereby ending the readout operation.

If, however, the data at step (24) was at the low level, the flow proceeds to step (27), at which the control signal 64, is output from the memory array selection circuit 80 so as to issue a command to select the second memory matrix array 53.

Thereafter, proceeding to step (28), the prescribed data is read out by the differential sense amplifier circuit 23 from a prescribed address in the selected second memory matrix array 53.

Thereafter, step (29) and step (30) are the same as described above.

As will be clear from the above-noted description, in a data storage and readout method using the above-noted non-volatile semiconductor memory device according to the present invention, the non-volatile semiconductor memory device is one that has an electrically rewritable memory matrix array, this memory matrix array being a first non-volatile semiconductor memory matrix array and a second non-volatile semiconductor memory matrix array that has the same construction as the first non-volatile semiconductor memory matrix array, the data processing method being that of separately storing into one and the same address in the first and second non-volatile semiconductor memory matrix arrays data that is the same but of different polarity.

Another feature of the above-noted data processing method is that both of the data that are stored in the same addresses in the first and second non-volatile semiconductor memory matrix arrays are simultaneously detected and also detected as a differential value of the two data.

Additionally, in executing data processing using the above-noted second example of a non-volatile semiconductor memory device according to the present invention, the memory device is a non-volatile semiconductor memory device having a memory matrix array that is capable of electrical programmable, this memory matrix array being a first non-volatile semiconductor memory matrix array and a second non-volatile semiconductor memory matrix array that has the same construction as the first non-volatile semiconductor memory matrix array, wherein during the time when processing is being executed of writing into one of the first and second memory matrix arrays, processing of erasure of the other memory matrix array is executed.

What is claimed is:

1. A non-volatile semiconductor memory device having an electrically programmable memory matrix array, said memory matrix array being formed by a first non-volatile semiconductor memory matrix array and a second non-volatile semiconductor memory matrix array that has the same construction as said first non-volatile semiconductor memory matrix array, said memory device further comprising:

an input data inverting circuit, which is connected to said second non-volatile semiconductor memory matrix array for the purpose of programming inverted data of said first non-volatile semiconductor memory matrix array; and a differential sense amplifier circuit, which is connected to both the first non-volatile semiconductor memory matrix array and the second non-volatile semiconductor memory matrix array for the purpose of reading out data of the first and second non-volatile semiconductor memory matrix arrays;

wherein a first column address selection circuit and a first row address selection circuit that are connected to said first non-volatile semiconductor memory matrix array and a second column address selection circuit and a second row address selection circuit that are connected to said second non-volatile semiconductor memory matrix array function so as to simultaneously select one and the same address position in said first and second non-volatile semiconductor memory matrix arrays for one program operation; and wherein data stored in said one and the same address position simultaneously in both said first and the second memory matrix arrays are both the same data as each other, but with opposite electric polarity from each other.

2. The non-volatile semiconductor memory device according to any one of claim 1 wherein said differential sense amplifier circuit is configured so as to output a voltage difference between data stored in one and the same address position in said first and second non-volatile semiconductor memory matrix arrays.

3. The semiconductor memory device according to claim 1, wherein said column address circuits and said row address selection circuit are connected to a common address decoder circuit.

4. A non-volatile semiconductor memory device having an electrically programmable memory matrix array, said memory matrix array being formed by a first non-volatile semiconductor memory matrix array and a second non-volatile semiconductor memory matrix array that has the same construction as said first non-volatile semiconductor memory matrix array, said memory device further comprising:

an input data inverting circuit, which is connected to said second non-volatile semiconductor memory matrix array for the purpose of programming inverted data of said first non-volatile semiconductor memory matrix array;

a differential sense amplifier circuit, which connects both the first non-volatile semiconductor memory matrix array and the second non-volatile semiconductor memory matrix array, for the purpose of reading out data of the first and second non-volatile semiconductor memory matrix arrays; and a memory matrix array selection circuit, which selects either said first or second non-volatile semiconductor memory matrix array or both.

5. The non-volatile semiconductor memory device according to claim 4, further comprising a control circuit that minimally controls said memory matrix array selection circuit, said input data inverting circuit, and said differential sense amplifier circuit.

6. The non-volatile semiconductor memory device according to any one of claim 1, 11 12 or 17, wherein each transistor part that makes up said first and second non-volatile semiconductor memory matrix arrays has a configuration comprising silicon oxide film layer, a silicon nitride film layer, a silicon oxide film layer and a metal film layer each being laminated to each other in this order onto a substrate.

* * * * *

UNITED STATES PATENT AND TRADEMARK OFFICE
CERTIFICATE OF CORRECTION

PATENT NO.    : 6,330,186 B2
DATED         : December 11, 2001
INVENTOR(S)   : Toshiaki Tanaka It is certified that error appears in the above-identified patent and that said Letters Patent is hereby corrected as shown below:

Column 22,
Line 66, after "claim 1" insert -- or 3 --; and

Column 24,
Line 15, delete "11 12 or 17" and insert -- 3, 4, or 5 --.

Signed and Sealed this

Tenth Day of September, 2002

Attest:

Attesting Officer

JAMES E. ROGAN
Director of the United States Patent and Trademark Office